United States Patent
Lee et al.

(10) Patent No.: US 6,816,373 B2
(45) Date of Patent: Nov. 9, 2004

(54) HEAT DISSIPATION DEVICE

(75) Inventors: Hsieh Kun Lee, Tu-Chen (TW);
Chun-Chi Chen, Tu-Chen (TW); Chin Hsien Lan, Tu-Chen (TW); Meng Fu, Shenzhen (CN)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 16 days.

(21) Appl. No.: 10/342,507

(22) Filed: Jan. 14, 2003

(65) Prior Publication Data
US 2004/0066624 A1 Apr. 8, 2004

(30) Foreign Application Priority Data
Oct. 4, 2002 (TW) ..................................... 91215777 U

(51) Int. Cl.[7] .............................................. H05K 7/20
(52) U.S. Cl. ..................... 361/697; 165/80.3; 165/185; 165/121; 165/125; 174/16.3; 257/719; 257/722; 361/704; 361/710; 361/703; 361/695
(58) Field of Search .......................... 165/80.3, 104.21, 165/121, 125, 104.33, 185; 174/16.3; 257/718–719, 726–727, 722; 361/687, 694–695, 697, 700, 703, 710

(56) References Cited

U.S. PATENT DOCUMENTS

| 5,597,034 | A | * | 1/1997 | Barker et al. .............. 165/80.3 |
| 6,196,300 | B1 | * | 3/2001 | Checchetti ................. 165/80.3 |
| 6,382,306 | B1 | * | 5/2002 | Hsu .......................... 165/80.3 |
| 6,598,667 | B1 | * | 7/2003 | Kuo .......................... 165/80.3 |
| 2003/0020327 | A1 | * | 1/2003 | Isono et al. | |

* cited by examiner

Primary Examiner—Gregory D. Thompson
(74) Attorney, Agent, or Firm—Wei Te Chung

(57) ABSTRACT

A heat dissipation device for dissipating heat from an electronic package (80) includes a heat sink (10) and a fan (30). The heat sink includes a base (12) and a plurality of fins (14). The base has a first surface (122) in thermal contact with the electronic package and a pair of sloped heat dissipation surfaces (126). The fins are perpendicularly attached on the heat dissipation surfaces. The fan is supported on the heat sink. During operation of the heat dissipation device, the cooling air is drawn into the heat sink by the fan and exits the heat sink along the heat dissipation surfaces.

15 Claims, 3 Drawing Sheets

HEAT DISSIPATION DEVICE

BACKGROUND OF THE INVENTION

1. Field of the Invention

The present invention relates to heat dissipation devices, and more particularly to a heat dissipation device which is attached to an electronic package to remove heat therefrom.

2. Description of Prior Art

With the rapid development of electronics technology, electronic packages such as CPUs are able to process signals at unprecedented high speeds. As a result, CPUs can generate copious amounts of heat. The heat must be efficiently removed from the CPU; otherwise, abnormal operation or damage may result. Heat dissipation devices are attached to the CPU to remove heat therefrom.

FIG. 3 shows a conventional heat dissipation device 20. The heat dissipation device 20 comprises a flat base 22, a plurality of fins 24 extending from the base 22, and a fan 26 mounted on the fins 24. During operation of the heat dissipation device 20, the fan 26 draws ambient cooling air to the heat dissipation device 20. The air flows down in grooves defined between the fins 24 for heat exchange with the fins 24. When the air arrives at the base 22, some of it simply refluxes instead of exiting from the groove. When the refluxed air meets downward flowing air, turbulence is created, and some of the downward flowing air is even prevented from entering the heat dissipation device. Thus an overall speed and efficiency of cooling airflow is retarded. This can seriously affect the heat dissipation capability of the heat dissipation device.

SUMMARY OF THE INVENTION

Accordingly, an object of the present invention is to provide a heat dissipation device which provides smooth and substantially unencumbered airflow for good heat dissipation capability.

In order to achieve the object set out above, a heat dissipation device in accordance with a preferred embodiment of the present invention comprises a heat sink and a fan. The heat sink includes a base and a plurality of fins. The base has a first surface in thermal contact with the electronic package and a pair of sloped heat dissipation surfaces. The fins are perpendicularly attached on the heat dissipation surfaces. The fan is supported on the heat sink. During operation of the heat dissipation device, the cooling air is drawn into the heat sink by the fan and exits the heat sink along the heat dissipation surfaces.

Other objects, advantages and novel features of the present invention will become more apparent from the following detailed description when taken in conjunction with the accompanying drawings, in which:

DETAILED DESCRIPTION OF THE INVENTION

Figure 1:
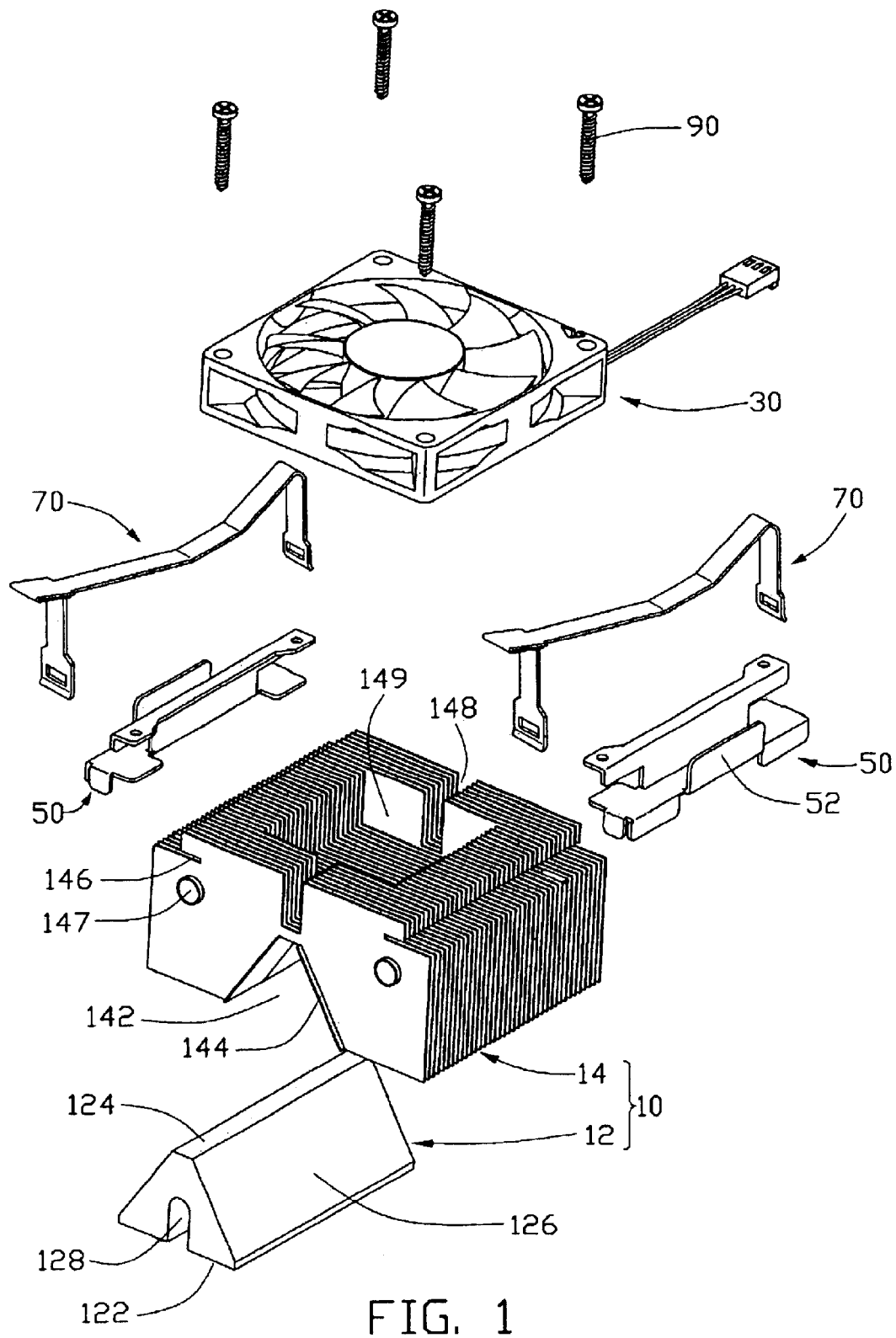
FIG. 1 is an exploded isometric view of a heat dissipation device in accordance with a preferred embodiment of the present invention.

Referring to FIG. 1, a heat dissipation device in accordance with a preferred embodiment of the present invention comprises a heat sink 10, a fan 30 and a pair of fan holders 50.

The heat sink 10 comprises a base 12 and a plurality of fins 14. The base 12 is substantially an elongated trapezoidal block. The base 12 comprises parallel first and second surfaces 122, 124, and a pair of sloped surfaces 126 spanning between the first and second surfaces 122, 124. The first surface 122 is adapted to be in thermal contact with a surface of an electronic package 80 (see FIG. 2), with thermal grease therebetween. The second surface 124 and the sloped surfaces 126 provide the base 12 with heat dissipation surfaces. The base 12 defines a pair of inverted U-shaped grooves 128 at opposite ends of the first surface 122.

Each fin 14 defines a cutout 142. All the cutouts 142 of the fins 14 cooperatively define a channel (not labeled) receiving the base 12 therein. A pair of bent flanges 144 is perpendicularly formed on each fin 14 at the cutout 142. The bent flanges 144 are soldered to the sloped surfaces 126 of the base 12 for providing great heat transfer capability between the base 12 and the fins 14. A slot 148 is defined in each fin 14 substantially opposite from the cutout 142. Slots 148 of centermost of the fins 14 are wider than slots 148 of the other fins 14. All the slots 148 cooperatively define a wind chamber 149. Each fin 14 further defines a pair of splits 146 at opposite sides of the slot 148, the splits 146 engagingly receiving the fan holders 50. A pair of holes 147 is defined in each fin 14 respectively below the splits 146, for facilitating positioning of the fins 14 during assembly of the heat sink 10. The fan 30 is secured on the fan holders 50 using four screws 90. Each fan holder 50 is positioned on the fins 14 in the splits 146, thereby supporting the fan 30 above the fins 14. A pair of resilient clips 70 is pressed onto the fan holders 50 and engaged with complementary components such as ears of a socket (not shown), thereby attaching the heat dissipation device to the electronic package 80. The first surface 122 is thus in thermal contact with a top surface of the electronic package 80. Each fan holder 50 has an upwardly extending blocking flange 52 to prevent a corresponding clip 70 from being outwardly displaced.

Figure 2:
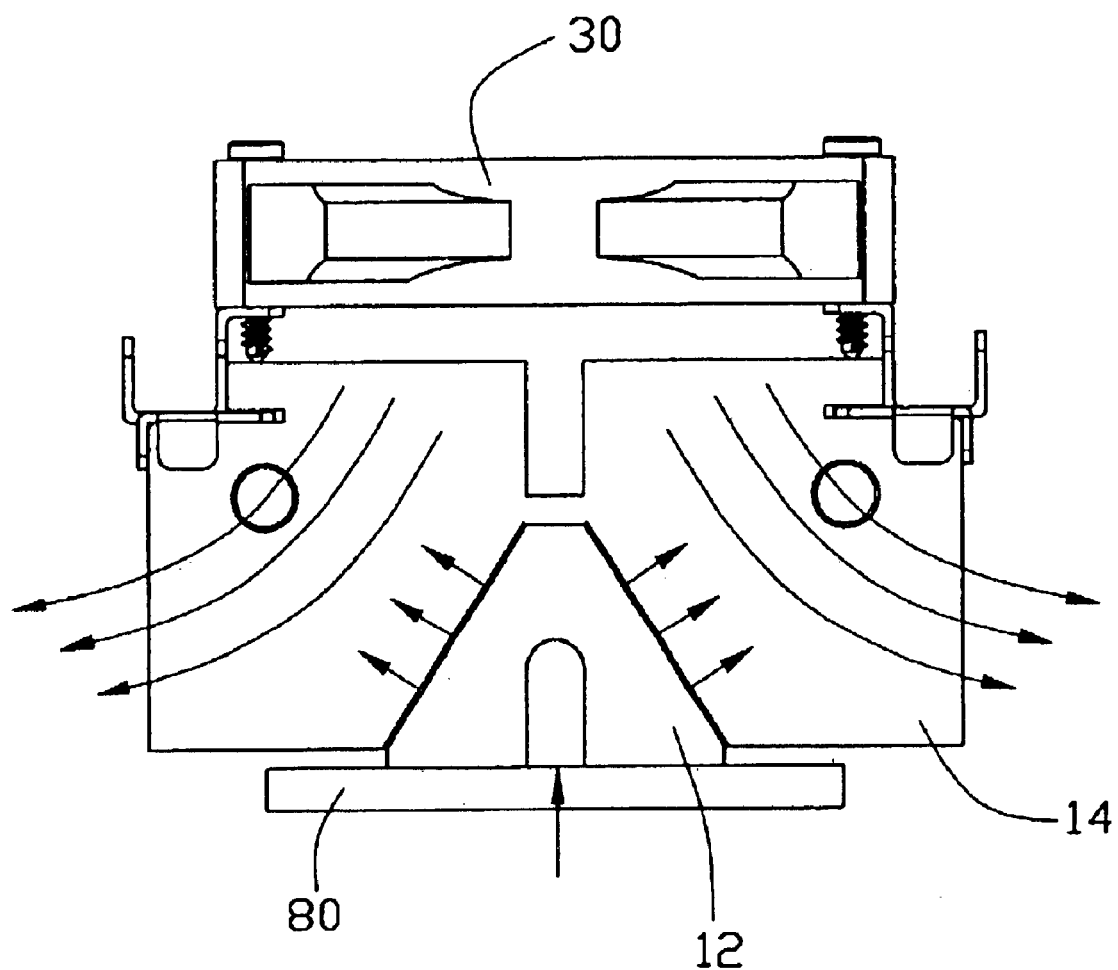
FIG. 2 is a schematic side elevation view of the heat dissipation device of FIG. 1 fully assembled, showing directions of airflow and directions of heat transfer.
Figure 3:
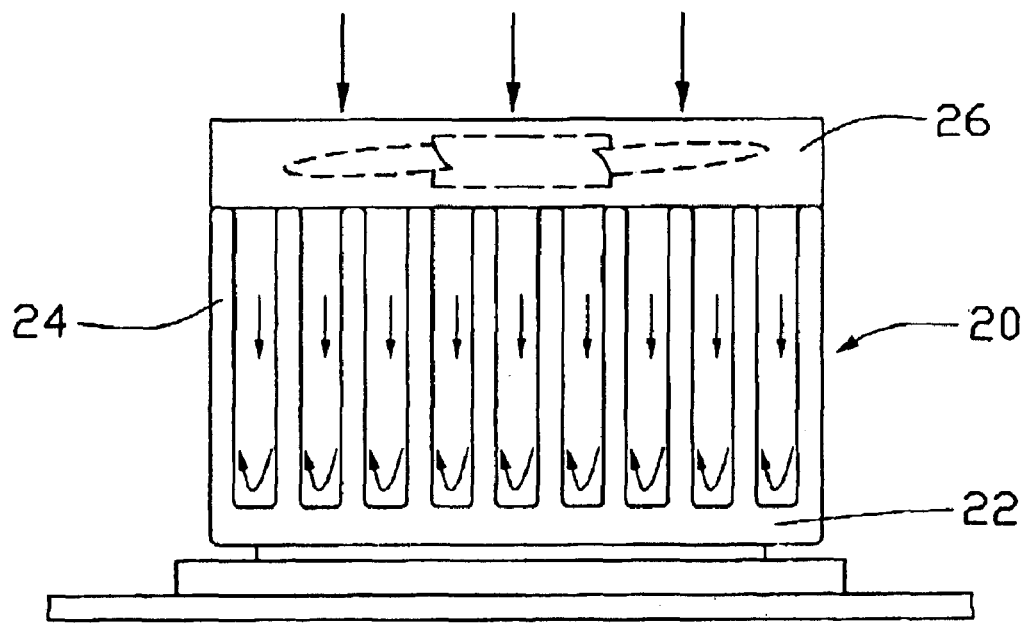
FIG. 3 is a side elevation view of a conventional heat dissipation device, showing directions of airflow thereat.

Referring also to FIG. 2, during operation of the heat dissipation device, heat accumulated on the electronic package 80 is transferred to the base 12 via the first surface 122, and further dissipated via the second surface 124 and the sloped surfaces 126. Simultaneously, cooling ambient air is drawn into the heat dissipation device via the fan 30, so that the cooling air exchanges heat with the fins 14. The air subsequently exits the heat dissipation device along the sloped surfaces 126 of the base 12 substantially without obstruction. Thus, the heat dissipation device can have great heat dissipation capability.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A heat dissipation device for dissipating heat from an electronic package, comprising:

a heat sink comprising a base and a plurality of fins, the base having a bottom surface for thermal contact with the electronic package, a groove formed in the base through the bottom surface and a pair of sloped heat dissipation surfaces, the fins being perpendicularly attached on the heat dissipation surfaces; and a fan supported above the heat sink;

wherein cooling air is drawn into the heat sink by the fan, and exits the heat sink along the heat dissipation surfaces.

2. The heat dissipation device of claim 1, wherein a wind chamber is defined at upper portions of the fins.

3. The heat dissipation device of claim 2, wherein a pair of splits is defined in each of the fins at opposite sides of the wind chamber, for facilitating positioning of the fan above the heat sink.

4. The heat dissipation device of claim 3, further comprising a pair of fan holders engaged in the splits of the fins.

5. The heat dissipation device of claim 4, further comprising a pair of clips for securing the heat dissipation device to the electronic device.

6. The heat dissipation device of claim 5, wherein each of the fan holders has an upwardly extending blocking flange for preventing a corresponding clip from being outwardly displaced.

7. The heat dissipation device of claim 1, wherein the bottom surface of the base is flat.

8. The heat dissipation device of claim 1, wherein each of the fins defines a cutout therein dimensioned for fitting attachment of each fin on the heat dissipation surfaces of the base.

9. The heat dissipation device of claim 8, wherein a pair of bent flanges is perpendicularly formed on each of the fins at the cutout.

10. The heat dissipation device of claim 9, wherein the bent flanges are soldered on the heat dissipation surfaces for providing great heat transfer capability between the base and each fin.

11. The heat dissipation device of claim 10, wherein a pair of holes is defined in each of the fins for facilitating positioning of the fins during assembly of the heat sink.

12. A heat dissipation device comprising:

a heat sink including a base and a plurality of parallel fins extending along a lengthwise direction and perpendicular disposed on said base;

a channel formed between every adjacent two fins;

a pair of sloped heat dissipation surfaces symmetrically defined in a lower portion of said heat sink among said fins;

a fan supportably seated upon the fins; and a chamber defined in the heat sink, under the fan, above said pair of sloped heat dissipation surfaces, and in communication with said channels.

13. The heat dissipation device of claim 12, wherein said chamber communicates with an exterior not only via said channels along said lengthwise direction but also via slots in a lateral direction perpendicular to said lengthwise direction.

14. The heat sink dissipation device of claim 12, wherein said sloped heat sink dissipation surfaces communicate with an exterior along said lengthwise direction.

15. The heat sink dissipation device of claim 12, wherein said chamber communicates with said pair of sloped heat sink dissipation surfaces downwardly.

* * * * *